(12) United States Patent
Song et al.

(10) Patent No.: US 10,622,991 B2
(45) Date of Patent: Apr. 14, 2020

(54) SWITCH DRIVER

(71) Applicant: Dialog Semiconductor (UK) Limited, London (GB)

(72) Inventors: Zhenyu Song, Beijing (CN); Libo Zhou, Beijing (CN); Wei Zi, Beijing (CN); Guanou Yang, Beijing (CN); Nailong Wang, Beijing (CN)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/125,086

(22) Filed: Sep. 7, 2018

(65) Prior Publication Data

US 2019/0140632 A1    May 9, 2019

Related U.S. Application Data

(63) Continuation of application No. PCT/CN2017/109254, filed on Nov. 3, 2017.

(51) Int. Cl.
| | | |
|---|---|---|
| *H03K 17/16* | (2006.01) | |
| *H03K 17/0812* | (2006.01) | |
| *H02M 1/44* | (2007.01) | |
| *H02M 3/156* | (2006.01) | |
| *H02M 1/00* | (2006.01) | |

(52) U.S. Cl.
CPC ............ *H03K 17/166* (2013.01); *H02M 1/44* (2013.01); *H02M 3/156* (2013.01); *H03K 17/0812* (2013.01); *H03K 17/163* (2013.01); *H02M 2001/0058* (2013.01)

(58) Field of Classification Search
None
See application file for complete search history.

(56) References Cited

U.S. PATENT DOCUMENTS

| | | | |
|---|---|---|---|
| 6,097,582 A | 8/2000 | John et al. | |
| 8,564,222 B2* | 10/2013 | Chiang | H05B 33/0815 315/200 R |
| 9,291,678 B2* | 3/2016 | Aalund | G01R 31/343 |
| 9,698,695 B1* | 7/2017 | Fahlenkamp | H02M 3/33507 |
| 2011/0316838 A1 | 12/2011 | Ahn | |
| 2013/0107584 A1 | 5/2013 | Li et al. | |

(Continued)

FOREIGN PATENT DOCUMENTS

| | | |
|---|---|---|
| CN | 1913311 | 2/2007 |
| CN | 101073196 | 11/2007 |

(Continued)

OTHER PUBLICATIONS

PCT International Search Report and Written Opinion, PCT Application No. PCT/CN2017/109254, dated Aug. 8, 2018, 9 pages.

*Primary Examiner* — Lincoln D Donovan
*Assistant Examiner* — Khareem E Almo
(74) *Attorney, Agent, or Firm* — Saile Ackerman LLC; Stephen B. Ackerman

(57) ABSTRACT

The present disclosure relates to an apparatus and method for driving a switch, such as a power switch. A driver comprises a voltage sensor to sense a drive voltage, and an electrical source to provide a drive signal having a drive value. The driver is adapted to adjust the drive value based on the drive voltage to limit a switch-current flowing through the switch.

19 Claims, 10 Drawing Sheets

(56) References Cited

U.S. PATENT DOCUMENTS

| | | | |
|---|---|---|---|
| 2013/0250636 A1* | 9/2013 | Arimura | H02M 7/797 363/78 |
| 2013/0307505 A1 | 11/2013 | Daniel et al. | |
| 2014/0203843 A1* | 7/2014 | Cottell | H03K 17/78 327/81 |
| 2014/0225525 A1* | 8/2014 | Lin | H05B 33/08 315/291 |
| 2015/0103566 A1* | 4/2015 | Keogh | H02M 3/33507 363/21.12 |
| 2015/0171852 A1 | 6/2015 | Pang | |
| 2017/0155322 A1 | 6/2017 | Zhang et al. | |
| 2018/0102774 A1* | 4/2018 | Leong | G05F 1/56 |
| 2018/0241306 A1* | 8/2018 | Takahashi | H02M 1/36 |
| 2018/0342942 A1* | 11/2018 | Iyasu | H02M 3/33507 |
| 2019/0058411 A1* | 2/2019 | Kitamoto | H02M 3/1584 |

FOREIGN PATENT DOCUMENTS

| | | |
|---|---|---|
| CN | 104363011 | 2/2015 |
| CN | 105099143 | 11/2015 |
| CN | 205178854 | 4/2016 |
| CN | 205847212 | 12/2016 |
| CN | 106685196 | 5/2017 |
| CN | 107026638 | 8/2017 |

* cited by examiner

Truth Table

| Th1 | Th2 | Output Currrent |
|---|---|---|
| 0 | 0 | I1 |
| 1 | 0 | I2 |
| 0 | 0 | I3 (Th1 need back to 0 from 1, as Vref1 has hysteresis) |
| 0 | 1 | Full pullup |

FIG. 10

SWITCH DRIVER

This application is a Continuation of: PCT application number PCT/CN2017/109254, filed Nov. 3, 2017, which is owned by a common assignee and is herein incorporated by reference in its entirety.

TECHNICAL FIELD

The present disclosure relates to an apparatus and method for driving a switch. In particular, the invention relates to a driver for driving a power transistor.

BACKGROUND

Transistor devices such as metal-oxide-semiconductor field-effect transistors (MOSFET), bipolar junction transistors (BJT) or insulated-gate bipolar transistors (IGBT) are used in a wide variety of applications. In particular, IGBT transistors provide fast switching, high current, and high voltage capabilities making such transistors ideally suited for switch-mode power conversion applications.

Transistors are typically operated using a driver connected to the transistor. For instance, most IGBT transistors have three terminals referred to as gate, collector, and emitter. The ON or OFF state of the IGBT transistor can be controlled by modulating the gate-to-emitter voltage $V_{GE}$ via a gate driver circuit. When the voltage across $V_{GE}$ exceeds a threshold voltage $V_{th}$, the IGBT may be placed in the ON state (close), allowing a current, also referred to as switch-current, to flow through the collector and emitter terminals. Likewise, when the voltage across $V_{GE}$ is below $V_{th}$, the IGBT may be placed in the OFF state (open), and the transistor does not conduct.

A transistor may be operated using different turn-on approaches referred to as hard and soft. When driving the transistor with a hard turn-on, the voltage $V_{CE}$ is positive when the gate voltage $V_G$ is greater than $V_{th}$. When driving the transistor with a soft turn-on, the voltage $V_{CE}$ is negative or null when the gate voltage $V_G$ is greater than $V_{th}$.

Driving the transistor with a hard turn-on may lead to large collector current $I_C$ spikes. When $V_{CE}$ is high enough for example greater than 5V, the saturation current of the transistor is a function of $V_{GE}$. Small variations in $V_{GE}$ can lead to large variations in $I_C$. For instance, while $I_C$ is about 25 A with $V_{GE}$=9V, the current $I_C$ can exceed one hundred amps with $V_{GE}$>12V. Such large $I_C$ spikes can degrade the reliability of the transistor itself or of other components present in the circuit, especially if $I_C$ exceeds the safe pulse collector current rating. In addition, large and fast current spikes can increase electromagnetic interferences.

SUMMARY

In order to address these disadvantages, soft turn-on techniques have been implemented. However, these techniques have a relatively low efficiency and require additional components which increase the cost and complexity of the circuit. It is an object of the disclosure to address one or more of the above-mentioned limitations.

According to a first aspect of the disclosure, there is provided a method of driving a switch comprising a drive terminal, the method comprising: applying a drive signal having a drive value to the drive terminal; sensing a drive voltage of the drive terminal; and adjusting the drive value based on the drive voltage to limit a switch-current flowing through the switch.

For example, the drive signal may be a drive current having a current value, or a drive voltage having a voltage value.

Optionally, the method comprises setting the drive value to a first level; and reducing the drive value to a second level upon identifying that the drive voltage has reached a first target value.

Optionally, the switch comprises a threshold voltage above which the switch starts conducting the switch-current; and wherein the first target value is greater than the threshold voltage. For example, the first target value may range between the threshold voltage and a rail voltage.

Optionally, the switch comprises a parasitic capacitor associated with a parasitic current; and wherein the second level is adjusted to maintain the drive voltage substantially constant as long as the parasitic current is positive. For example, the drive voltage may be substantially constant about the first target value.

The second level may be adjusted to the parasitic current. A feedback cycle may vary the parasitic current until the second level is equal to the parasitic current. For example, the parasitic current may be a Miller current.

Optionally, the parasitic current is null when the drive voltage increases above the first target value.

Optionally, the method comprising increasing the drive value to a third level upon identifying that the drive voltage has reached a second target value.

Optionally, the third level may be greater than the first level.

Optionally, the second target value is greater than the threshold voltage. For instance, the second target value may be greater than the first target value.

According to a second aspect of the disclosure, there is provided a driver for driving a switch, the driver comprising a voltage sensor to sense a drive voltage; an electrical source to provide a drive signal having a drive value; the driver being adapted to adjust the drive value based on the drive voltage to limit a switch-current flowing through the switch.

For example, the electrical source may be a current source for providing a drive current or a voltage source for providing a drive voltage.

Optionally, the driver comprises an adjuster coupled to the voltage sensor and to the electrical source, the adjuster being adapted to compare the drive voltage with at least one of a first target value and a second target value, and to provide a signal to adjust the drive value based on the comparison.

Optionally, the driver may be adapted to set the drive value to a first level; and to reduce the drive value to a second level upon identifying that the drive voltage has reached the first target value.

Optionally, the driver may be adapted to increase the drive value to a third level upon identifying that the drive voltage has reached the second target value.

Optionally, the switch comprises a threshold voltage above which the switch starts conducting the switch-current; and wherein the first target value is greater than the threshold voltage.

Optionally, the second target value is greater than the threshold voltage. For example, the second target value may be greater than the first target value.

Optionally, the third level is greater than the first level.

Optionally, the switch comprises a parasitic capacitor associated with a parasitic current; and wherein the second level is substantially equal to the parasitic current. For example, the parasitic current may be a Miller current.

Optionally, the parasitic current is null when the drive voltage increases above the first target value.

According to a third aspect of the disclosure, there is provided a circuit comprising a driver coupled to a switch; wherein the driver may be any driver according to the second aspect of the disclosure.

BRIEF DESCRIPTION OF THE DRAWINGS

The disclosure is described in further detail below by way of example and with reference to the accompanying drawings, in which:

FIG. 10 is a truth table illustrating the working of the voltage monitor of FIG. 9.

DESCRIPTION

Figure 1:
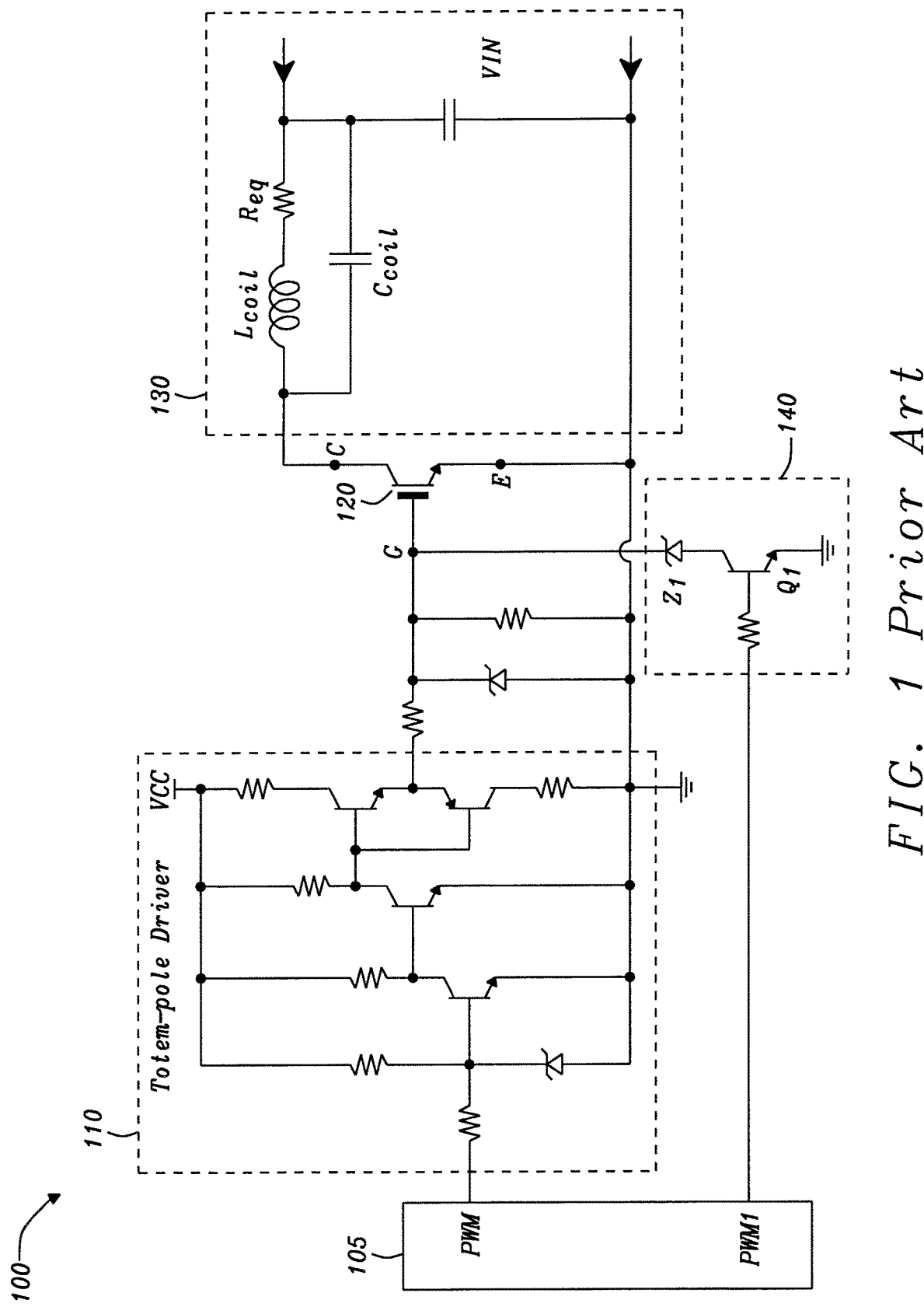
FIG. 1 is a diagram of a resonant converter circuit according to the prior art.

FIG. 1 illustrates a circuit 100 according to the prior art. The circuit 100 includes a Totem-pole driver 110 connected to an IGBT transistor 120 for operating a resonant power converter 130. A clamp circuit 140 is connected to the gate of the transistor 120. A signal generator 105 provides logic signals PWM and PWM1 to the driver 110 and to the clamp circuit 140 respectively. The clamp circuit 140 includes a BJT transistor Q1, a Zener diode Z1 and a resistance R1. The transistor Q1 has a drain connected to the gate of transistor 120 via the Zener diode Z1, a gate connected to the signal generator 105 and a source connected to ground. The clamp circuit 140 is used to limit the voltage $V_{GE}$ to 9V, allowing to keep the current Ic below 30 A.

Figure 2:
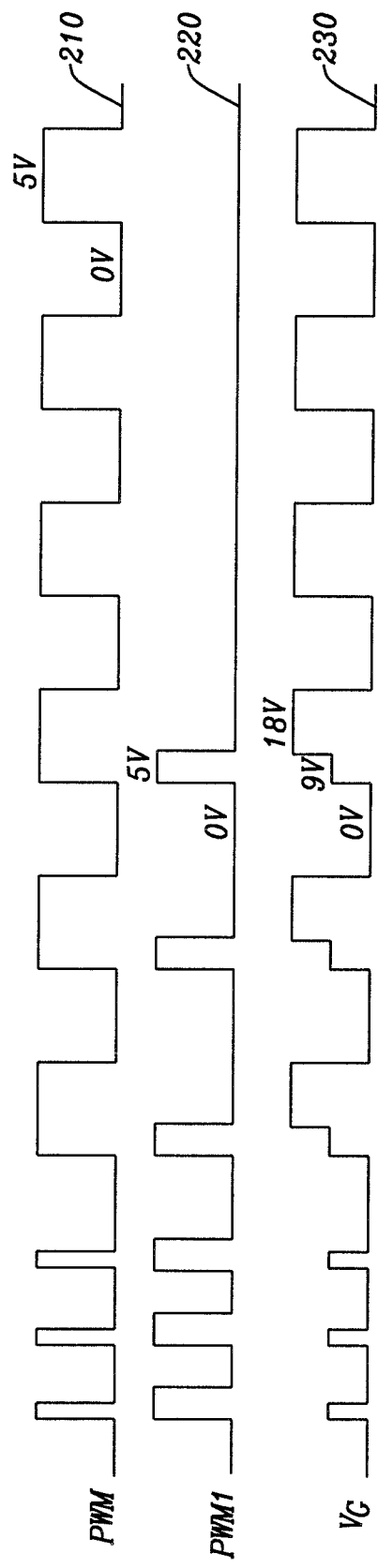
FIG. 2 is a timing diagram illustrating the working of the circuit of FIG. 1.

FIG. 2 illustrates the waveforms of the signals PWM 210, PWM1 220, and gate voltage $V_G$ 230. Soft turn-on is achieved using the PWM1 signal 220. When the PWM signal 210 is high (5V) and the PWM1 signal 220 is low (0V), the gate voltage $V_G$ is 18V. However, when PWM and the PWM1 signals are both high (5V), the gate voltage $V_G$ is reduced by 50% down to 9V.

By driving the power transistor 120 with a soft turn-on, Ic is limited to 30 Amps. However, this approach requires additional components for the clamp circuit 140, hence increasing manufacturing cost. In addition, the circuit of FIG. 2 has a relatively low efficiency. When the signal PWM1 220 is high, a current in the order of 200 mA or higher, passes through the Zener diode Z1. Therefore, the system dissipates a relatively large amount of energy. In addition, the signal PWM1 220 must be kept high (logic one) long enough to avoid generation of large Ic spikes. If the PWM1 signal is low (logic 0) before the collector-emitter voltage $V_{CE}$ of the transistor 120 has reached zero volts, then large Ic spikes may occur. On the contrary, if the PWM1 signal is low after $V_{CE}$ has reached zero volts, then a large on-resistance $R_{ON}$ of the transistor 120, due to low $V_{GE}$, leads to more conduction losses.

Figure 3:
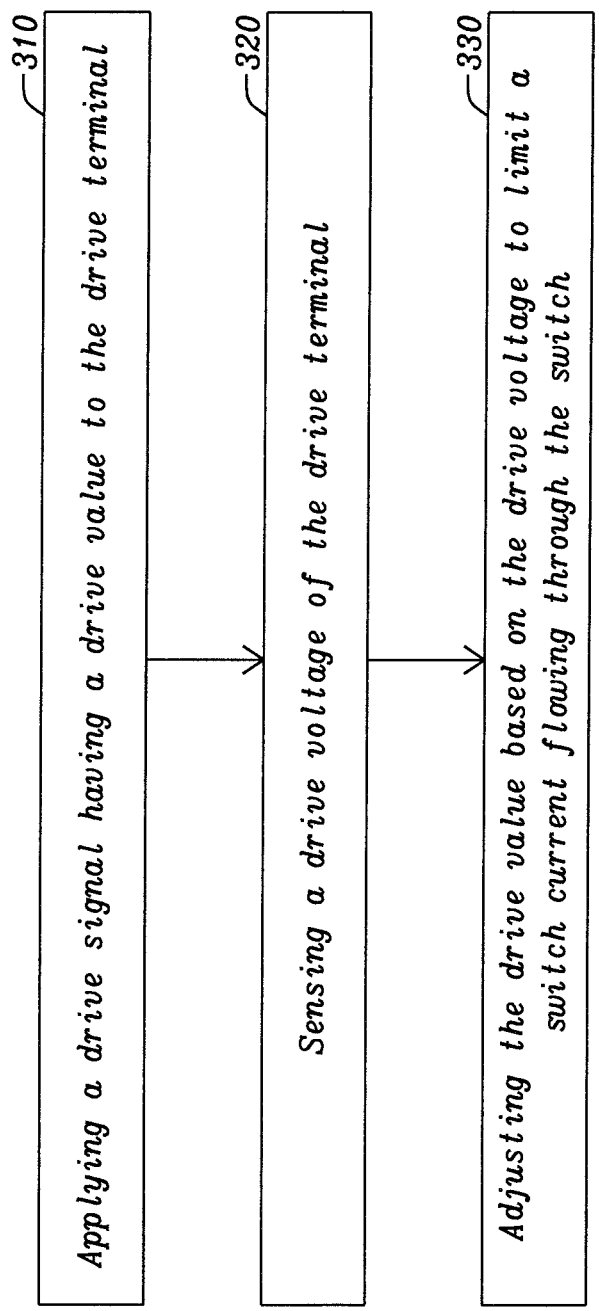
FIG. 3 is a flow chart of a method for driving a switch.

FIG. 3 is a flow chart of a method of operating a switch comprising a drive terminal. At step 310, a drive signal with a drive value is applied to the drive terminal. For example, the drive signal may be a drive current having a current value; or a drive voltage having a voltage value. At step 320, a drive voltage of the drive terminal is sensed. At step 330, the drive value is adjusted based on the drive voltage to limit a switch current flowing through the switch.

The method may be applied to different types of switches including bipolar transistors, MOSFET transistor and IGBT transistors. The proposed method allows driving a switch with greater efficiency and reliability. Such a method can be implemented without unduly increasing the complexity of the system.

Figure 4:
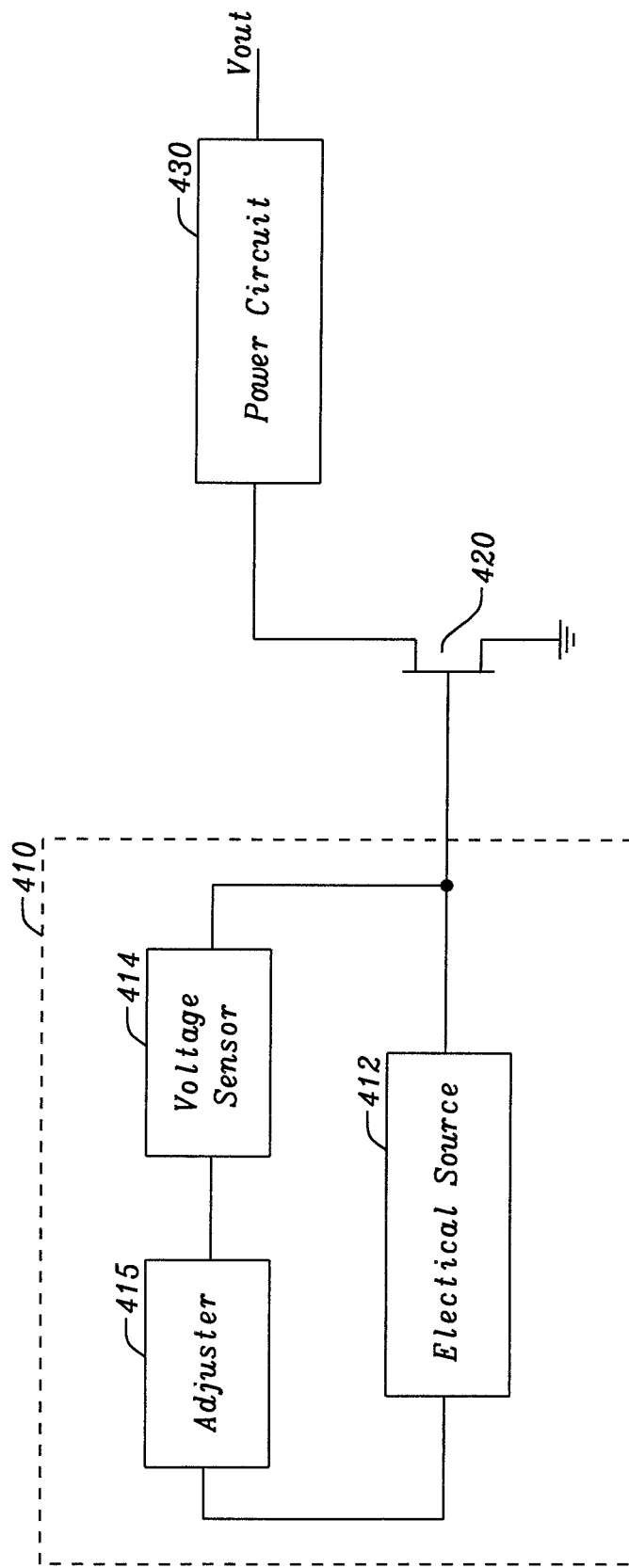
FIG. 4 is a diagram of a circuit for implementing the method according to FIG. 3.

FIG. 4 is a diagram of a circuit 400 for implementing the method according to FIG. 3. The circuit 400 includes a driver 410 connected to a power switch 420. The power switch 420 is coupled to a power circuit 430. The power switch 420 and power circuit 430 may form a switching converter, such as a resonant power converter, a buck, a boost or a buck boost converter. The power switch 420 may be coupled to the power circuit 430 in different ways depending on the topology of the converter.

The power switch 420 has three terminals referred to as, first, second and third. The first terminal, also referred to as drive terminal, is used to turn the power switch on (closed) or off (open). The second and third terminals are provided to couple the power switch to the power circuit 430. The power switch 420 may be a power transistor, such as a metal-oxide-semiconductor field-effect transistor (MOSFET) a bipolar junction transistor (BIT) or an insulated-gate bipolar transistor (IGBT).

The driver 410 comprises an electrical source 412 for providing a drive signal, a voltage sensor 414 to sense a drive voltage at the drive terminal, and an adjuster 415 to monitor the drive voltage and adjust the value of the drive signal based on the drive voltage. For example, the electrical source 412 may be a current source proving a drive current, or a voltage source providing a drive voltage. The voltage sensor 414 and the adjuster 415 may form a voltage monitor. For example, the adjuster 415 may be adapted to compare the drive voltage with one or more target values and to provide a control signal to the electrical source 412 to adjust the drive value. The adjuster 415 has an input coupled to the voltage sensor 414, and an output coupled to the electrical source 412. The voltage sensor 414 has an input coupled to the drive terminal and an output coupled to the adjuster 415. The voltage sensor 414 may amplify and/or filter the sensed voltage. Alternatively, the voltage sensor may be replaced by a single connection between the drive terminal and the adjuster 415. By adjusting the drive value, a switch current flowing through the power switch may be maintained below a maximum value.

Figure 5:
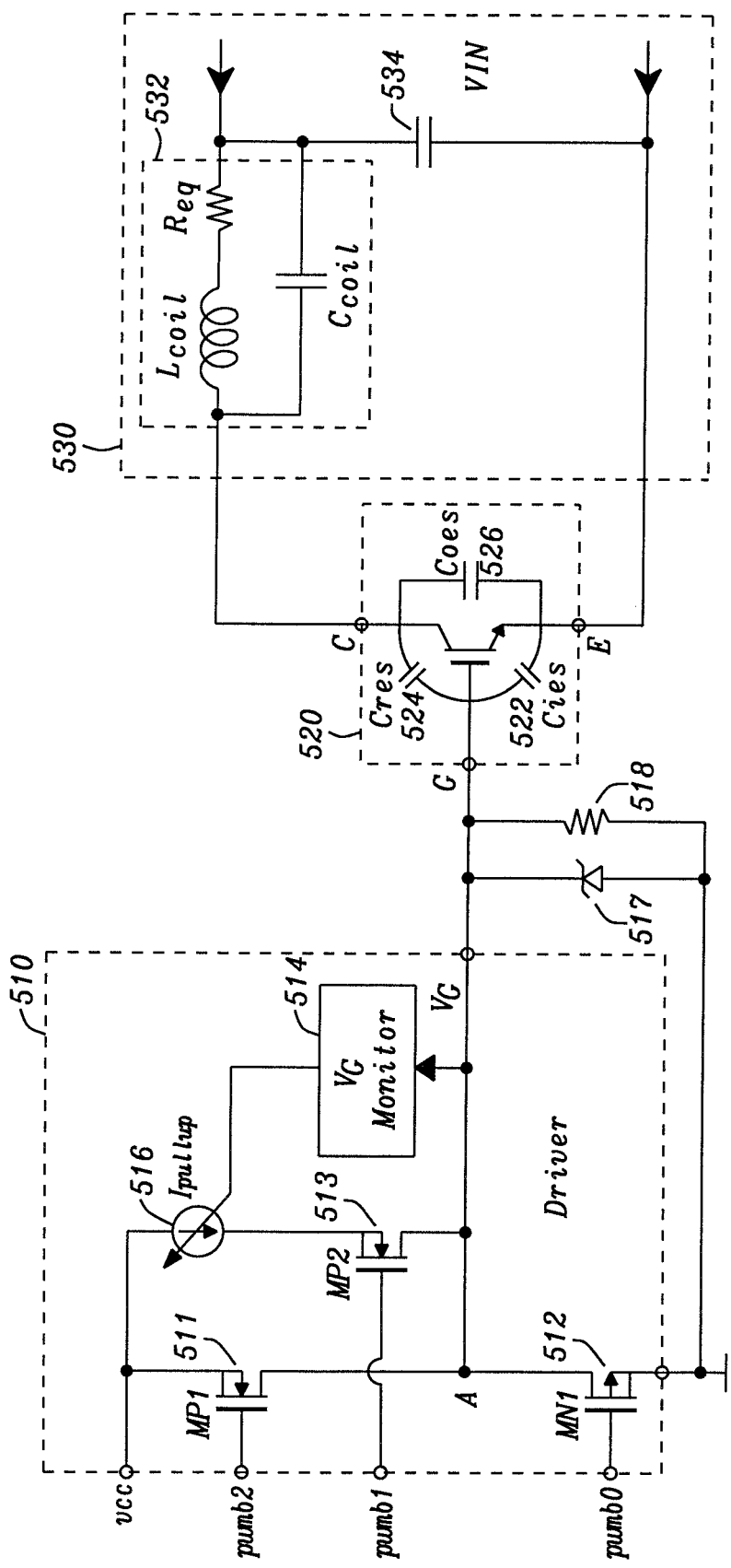
FIG. 5 is an exemplary embodiment of a circuit according to FIG. 4.

FIG. 5 is an exemplary circuit 500 for implementing the diagram of FIG. 4. The circuit 500 includes a driver 510 coupled to a power switch 520, and a power circuit 530.

In this example the power switch 520 is an insulated-gate bipolar transistor (IGBT), however the power switch 520 could be replaced by another type of transistor. The transistor 520 has a first terminal for example a gate terminal, a second terminal for example a collector terminal, and a third terminal for example an emitter terminal. The transistor 520 has three parasitic capacitors 522, 524 and 526. The first parasitic capacitor 522 has a capacitance $C_{ies}$ and is located between the first (gate) terminal and the third (emitter)

terminal. The second parasitic capacitor 524 has a capacitance $C_{res}$ and is located between the first (gate) terminal and the second (collector) terminal. The third parasitic capacitor 526 has a capacitance $C_{oes}$ and is located between the second (collector) terminal and the third (emitter) terminal.

The driver 510 includes a stage formed by a first transistor 511 coupled to a second transistor 512 at node A. The first transistor 511 has a first terminal, for example a source terminal coupled to a rail voltage Vcc, a second terminal, for example a drain terminal coupled to node A. The transistor 511 has a third terminal, for example a gate terminal for receiving a first drive signal, labelled pwmb2. The second transistor 512 has a first terminal, for example a drain terminal coupled to node A, a second terminal, for example a source terminal coupled to a ground. The transistor 512 has a third terminal, for example a gate terminal for receiving a second drive signal labelled pwmb0. A third transistor 513, has a first terminal, for example a source terminal coupled to the rail voltage Vcc via a variable current source 516, a second terminal, for example a drain terminal coupled to node A, and a third terminal, for example a gate terminal for receiving a third drive signal labelled pwmb1.

A voltage monitor 514, has an input coupled to the first (gate) terminal of the transistor 520, and an output coupled to the variable current source 516. The voltage monitor 514 is adapted to identify when the drive voltage has reached a specific target value. The monitor 514 may include a plurality of comparators. For instance, the monitor may include a first comparator to compare $V_G$ with a first target value, and a second comparator to compare $V_G$ with a second target value. Optionally, a Zener diode 517 coupled in parallel with a resistance 518 may be provided between the first terminal and the ground to protect the IGBT transistor 520.

The power circuit 530 includes an inductor 532 coupled to a capacitor 534. The inductor 532 can be represented by an inductance Lcoil, a resistance Req, and a capacitance Ccoil. The inductor 532 has a first terminal coupled to the collector terminal of the transistor and a second terminal coupled to the emitter terminal via the capacitor 534.

Figure 6:
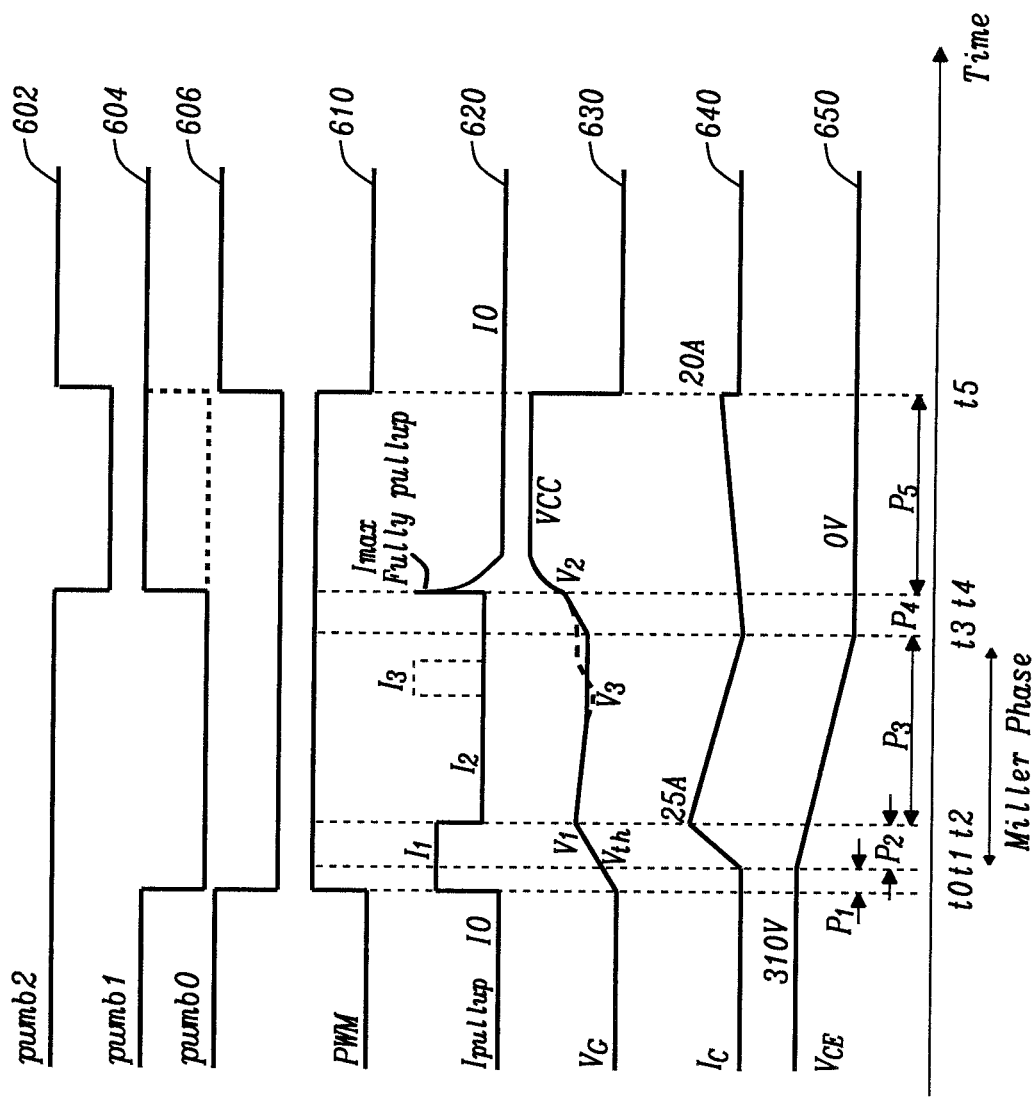
FIG. 6 is a timing diagram illustrating the working of the circuit of FIG. 5.

FIG. 6 is a timing diagram illustrating the working of the circuit of FIG. 5. The timing diagram shows the time evolution of the logic signals pwmb2 602, pwmb1 604, pwmb0 606 and PWM 610. The logic signal PWM 610 is the inverted signal of pwmb0 606. The timing diagram also represents the drive current 620, the drive voltage 630, the collector current 640, and the voltage $V_{CE}$ 650 between the second and third terminal of the transistor.

The power transistor 520 is turned-on using five phases labelled P1 to P5. At time t0, the logic signal 610 goes high, for example from a logic zero to a logic one. The driver 510 increases the drive current 620 from an initial level $I_0$ to a first level I1. The variable current source 516 is set to I1 and the transistor MP2 513 is turned ON (closed), while the transistors MP1 511 and MN1 512 are OFF (open). The gate voltage $V_G$ 630 starts to increase. The voltage $V_{CE}$ between the second and the third terminal of the transistor 520 is positive, for example 310 Volts.

Between the times t0 and t1, also referred to phase P1, the drive current I1 charges the first and second parasitic capacitors 522,524, and the voltage $V_{GE}$ rises from 0V to Vth. The collector current Ic 640 is equal to zero.

The current level I1 should be large enough to increase the gate voltage $V_G$ up to a first target value V1. However, the current I1 should not be too large to avoid $V_G$ overshooting too much above V1, which may lead to unwanted variations in the current Ic. Any overshoot should not exceed the second target value V2. The value of I1 would depend on the characteristics of the transistor 520. For example, I1 may range between about 10 mA to about 60 mA.

At time t1, $V_G$ reaches the threshold voltage Vth of the power transistor 520. The collector current Ic starts to increase from a minimum value for example 0 Amps, and the voltage $V_{CE}$ 650 starts to decrease from a maximum value for example 310 V.

Between the times t1 and t2, also referred to phase P2, the drive current I1 keep charging the first and second parasitic capacitors and $V_{GE}$ rises from Vth to V1. The current Ic 640 increases as an exponential function of a voltage $V_{GE}$ between the gate and the emitter terminals of the transistor. The voltage $V_{CE}$ 650 decreases with a slope defined by:

$$\frac{dV_{CE}}{dt} = \frac{I_C}{C_{Coil}} \tag{1}$$

in which $C_{Coil}$ is the capacitance of the inductor 532. As the voltage $V_{CE}$ 650 decreases, a Miller current $I_{Miller}$, sinks from the gate terminal to the collector terminal through the second parasitic capacitor 524. The Miller current $I_{Miller}$, can be expressed as:

$$I_{Miller} = \frac{dV_{CE}}{dt} C_{res} = I_C \frac{C_{res}}{C_{Coil}} \tag{2}$$

At time t2, $V_G$ 630 reaches the first target voltage V1, and the current Ic 640 reaches a maximum value, for example 25 Amps. The driver 510 reduces the drive current 620 from the first level I1 to a second level I2. The variable current source 516 is set to I2. The transistor MP2 513 remains turned ON (closed), while the transistors MP1 and MN1 are OFF (open). The second level I2 may be substantially equal to the miller current $I_{Miller}$ at time t2. If I2 equals $I_{Miller}$ at time t2, the voltage $V_{GE}$ is maintained around V1. However, the second level I2 may also be slightly less or slightly greater than the miller current $I_{miner}$ at time t2. The feedback cycle: $V_{GE} \rightarrow Ic \rightarrow dV_{CE}/dt \rightarrow I_{Miller} \rightarrow V_{GE}$, allows the current $I_{Miller}$ to be adjusted. For instance, if $I_2$ is less than $I_{Miller}$, the voltage $V_{GE}$ starts decreasing, as a result Ic is decreasing, $dV_{CE}/dt$ is decreasing, and $I_{Miller}$ is decreasing. Therefore, the negative feedback loop adjusts $I_{Miller}$ until $I_{Miller}$ equal I2, then settling $V_{GE}$ to a stable value. Similarly, if I2 is larger than $I_{miller}$, then $I_{Miller}$ increases until $I_{Miller}$ equal I2. Therefore, the negative feedback provided by the transistor 520 allows the voltage $V_G$ to be maintained relatively flat during the phase P3 between the times t2 and t3.

Between the times t2 and t3, the gate voltage 630 decreases from V1 to a value greater than Vth. As $V_{GE}$ decreases, the current Ic 640 decreases. The current $I_{Miller}$ is function of Ic (see equation 2). As explained above, as Ic decreases, $I_{Miller}$ decreases untill $I_{Miller}$ equals $I_2$. The voltage $V_{CE}$ 650 keeps decreasing down to zero. Once $V_{CE}$ equals zero, the Miller effect ends and $I_{Miller}$ equals zero. The phases P2 and P3 during which $V_{CE}$ is decreasing may be referred to as the Miller phase.

At time t3, the voltage $V_{CE}$ 650 is null. The current drive remains at level I2. The gate voltage $V_G$ 630 increases again, indicating the end of the miller phase ($I_{Miller}=0$).

At time t4, the voltage $V_G$ reaches a second target value V2, also referred to as trigger voltage, as it triggers an increase in drive current to bring $V_G$ to the rail voltage Vcc. The driver 510 increases the drive current from level I2 to level Imax. The driver 510 turns the transistor MP1 511 on (closed), in order to pull the voltage $V_G$ up to the Vcc as fast as possible. The transistor MN1 remains off (open), while the transistor MP2 may be on or off. This reduces conduction losses, and improves efficiency.

Between the times t4 and t5, also referred to as phase P5, the drive current decreases from level Imax to the initial level I0. The gate voltage $V_G$ increases from V2 to the rail voltage Vcc. The current Ic increases to a certain value, for example 20 Amps. At time t5, the logic signal 610, goes from a high value to a low value. The gate voltage $V_G$ decreases to zero, and the current Ic decreases to a zero.

By adjusting the drive current during the Miller phase, the Miller effect can be used to maintain $V_{GE}$ below a certain value, hence limiting the current Ic to a safe level, for instance below 30 Amps. Once the Miller phase has ended, the drive current can charge the gate terminal to a trigger voltage to pull $V_{GE}$ up to the rail voltage Vcc. Since $I_{Miller}$ vanishes at the end of the Miller phase, there is no need for additional detection circuitry. The driver can finish soft driving automatically, and pull $V_{GE}$ to $V_{CC}$ in order to reduce conduction losses. The proposed approach allows to turn a power switch safely without increasing the number of components or the complexity of the driver. For instance, there is no need for an additional circuit to clamp the gate voltage.

Figure 7:
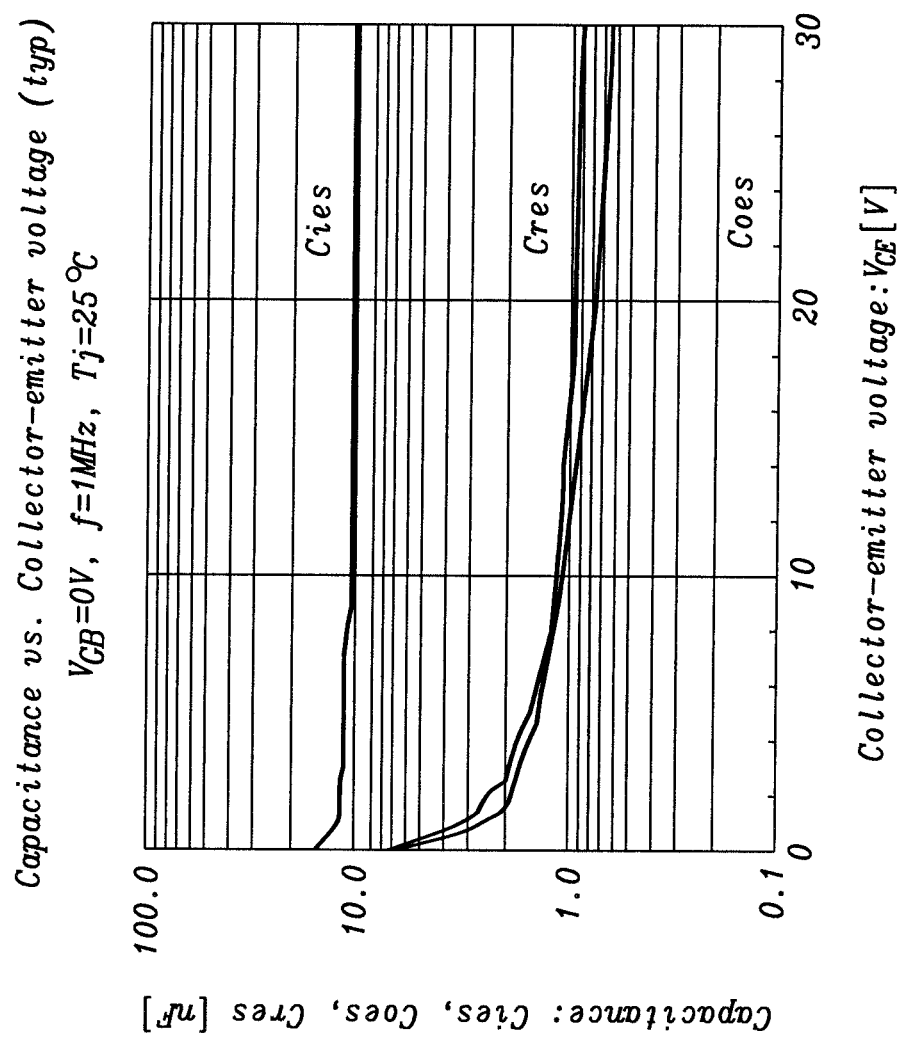
FIG. 7 is a measurement of the parasitic capacitances of a transistor obtained for different collector-emitter voltage values.

FIG. 7 illustrates the capacitance values Cies, Cres and Coes, of the first, second and third parasitic capacitors 522, 524, and 526, for different values of $V_{CE}$. Results were obtained for an IGBT transistor operated at 1 MHz with $V_{GE}$=0V, and a temperature of 25 degrees Celsius. The capacitance Cres increases when $V_{CE}$ drops. This increase is more pronounced for $V_{CE}$ values below 10V. Such an increase in Cres causes the current $I_{Miller}$ to increase significantly. As a result, the drive current may be significantly smaller than $I_{Miller}$, and the drive voltage may decrease below V1 during the Miller phase. If this is the case, the drive current may be increased momentarily to increase the drive voltage $V_G$ back to V1. This scenario is illustrated by current level I3 shown in dotted lines in FIG. 6.

Figure 8:
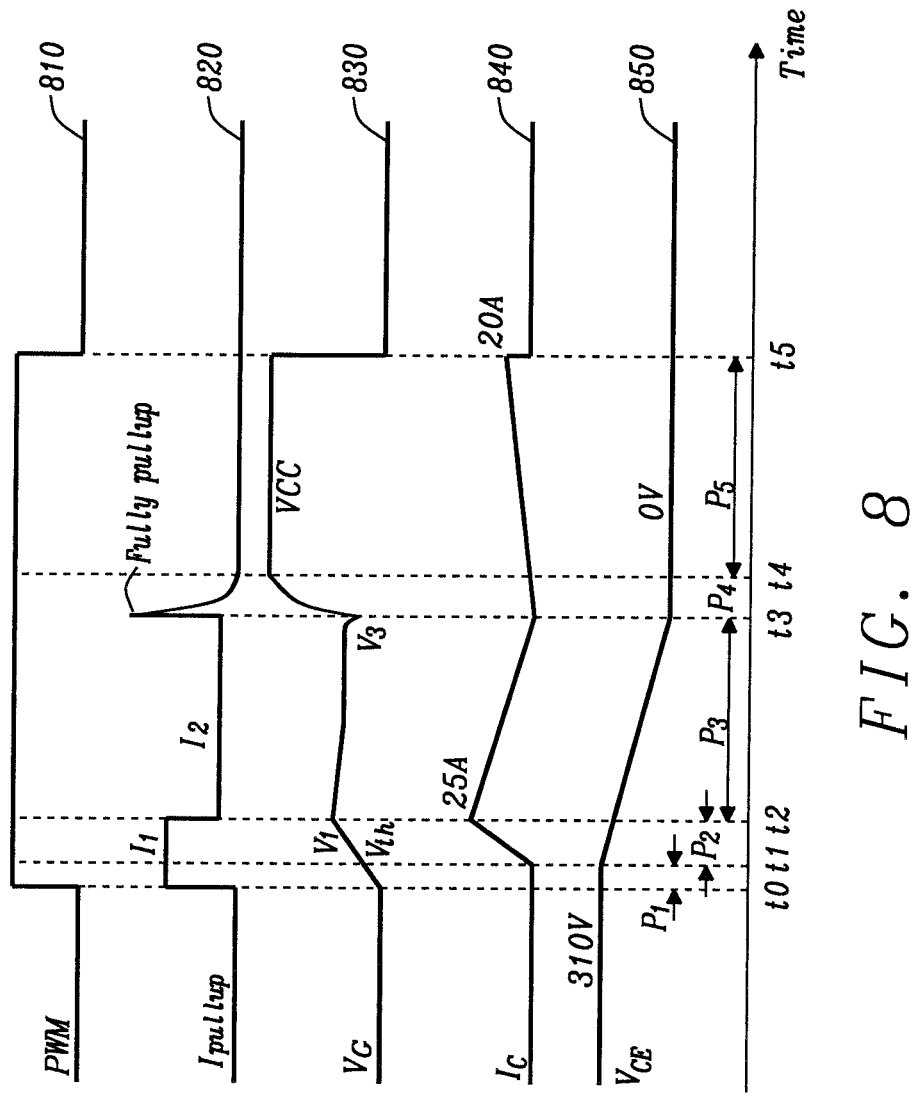
FIG. 8 is a timing diagram illustrating the turn on of an IGBT transistor.

FIG. 8 illustrates the drive signal 810, the drive current 820, the drive voltage 830, the collector current 840, and the voltage VCE 850 of a specific IGBT transistor. For this particular IGBT transistor, when $V_{CE}$ drops below 10V, the drive voltage $V_G$ drops systematically to the value V3. Knowing the value V3, it is possible to pullup the voltage $V_G$ fully when $V_G$ reaches the target value V3. At time t3, $V_G$ equals V3 and the driver 510 increases the drive current to charge $V_G$ to Vcc quickly.

Figure 9:
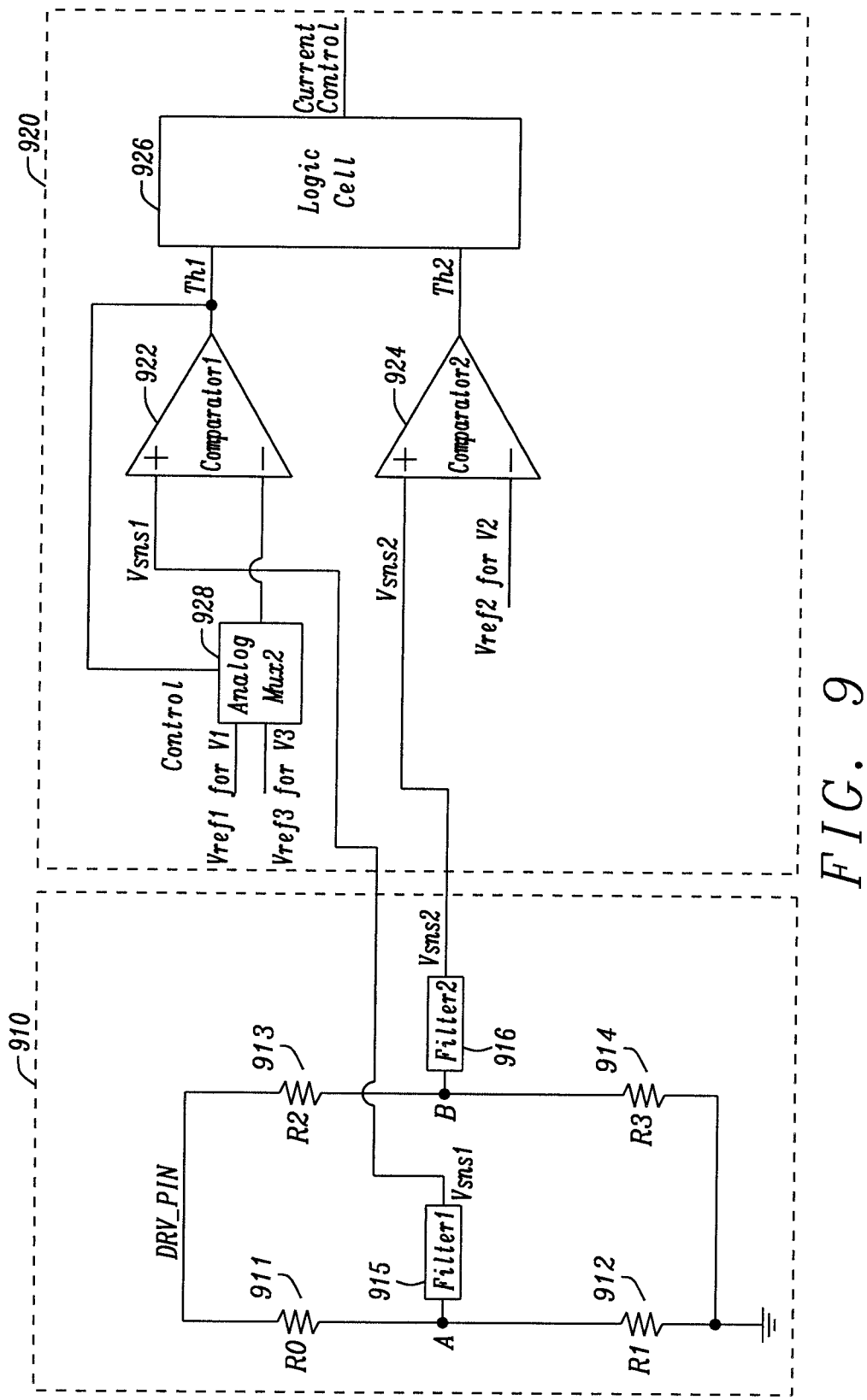
FIG. 9 is a voltage monitor for use in the circuit of FIG. 5.

FIG. 9 shows a possible embodiment for the monitor 514 of FIG. 5. The circuit 900 includes a voltage sensor 910 coupled to an adjuster 920. The voltage sensor 910 is formed by four resistances R0 911, R1 912, R2 913, R3 914. The resistances R0 and R1 are coupled in parallel with R2 and R3. A first filter 915 has an input coupled to R0 and R1 at node A and an output for providing a first sensed voltage Vsn1. A second filter 916 has an input coupled to R2 and R3 at node B and an output for providing a second sensed voltage Vsn2.

The adjuster 920, includes a first comparator 922, a second comparator 924, a memory device such as a logic cell 926 and an analog multiplexer 928. The first comparator 922 has a first input coupled to the analog multiplexer 928, a second input coupled to the filter 915 and an output coupled to the logic cell 926. The second comparator 924 has a first input coupled to a reference voltage Vref2, a second input coupled to the second filter 916 and an output coupled to the logic cell 926.

The analog multiplexer 928 has a first input coupled to a first reference voltage Vref1, a second input coupled to a third reference voltage Vref3, and a third input, also referred to as control input coupled to the output of the first comparator 922. The logic cell 926 has a first input for receiving an output signal Th1 from the first comparator 922, a second input for receiving an output signal Th2 from the second comparator 924 and an output to provide a control signal to an electrical source, such as a current source.

FIG. 10 shows a truth table for the circuit of FIG. 9. The output signals Th1 and Th2 of the first and second comparators may be high (logic 1) or low (logic 0). When Th1 is low, the analog multiplexer chooses Vref1 and when Th1 is high the analog multiplexer chooses Vref2. When the output signals Th1 and Th2 are both low, the logic cell provides a control signal to adjust the drive signal to a level I1 or a level I3. When Th1 is high and Th2 is low, the logic cell provides a control signal to adjust the drive signal to a level I2. When Th1 is low and Th2 is high, the logic cell provides a control signal to adjust the drive signal to a level Imax, also referred to as full pullup.

A skilled person will appreciate that variations of the disclosed arrangements are possible without departing from the disclosure. Accordingly, the above description of the specific embodiment is made by way of example only and not for the purposes of limitation. It will be clear to the skilled person that minor modifications may be made without significant changes to the operation described.

What is claimed is:

1. A method of driving a switch comprising a drive terminal and a parasitic capacitor associated with a parasitic current, the method comprising the steps of:
    applying a drive signal having a drive value to the drive terminal;
    sensing a drive voltage of the drive terminal; and
    adjusting the drive value based on the drive voltage to limit a switch-current flowing through the switch,
    the method further comprising setting the drive value to a first level; and adjusting the drive value to another level upon identifying that the drive voltage has reached a target value to adjust the parasitic current.

2. The method as claimed in claim 1; further comprising the steps of reducing the drive value to a second level upon identifying that the drive voltage has reached a first target value.

3. The method as claimed in claim 2; wherein the switch comprises a threshold voltage above which the switch starts conducting the switch-current; and wherein the first target value is greater than the threshold voltage.

4. The method as claimed in claim 1; wherein the said another level is adjusted to maintain the drive voltage substantially constant as long as the parasitic current is positive.

5. The method as claimed in claim 2; wherein the parasitic current is null when the drive voltage increases above the first target value.

6. The method as claimed in claim 1; further comprising the steps of increasing the drive value to a third level upon identifying that the drive voltage has reached a second target value.

7. The method as claimed in claim 6; wherein the third level is greater than the first level.

8. The method as claimed in claim 6; wherein the second target value is greater than the threshold voltage.

9. A driver for driving a switch comprising a parasitic capacitor associated with a parasitic current, the driver comprising a voltage sensor to sense a drive voltage;

an electrical source to provide a drive signal having a drive value;

the driver being adapted to adjust the drive value based on the drive voltage to limit a switch-current flowing through the switch;

wherein the driver is adapted to set the drive value to a first level; and to adjust the drive value to another level upon identifying that the drive voltage has reached a target value to adjust the parasitic current.

10. The driver as claimed in claim 9; comprising an adjuster coupled to the voltage sensor and to the electrical source, the adjuster being adapted to compare the drive voltage with at least one of a first target value and a second target value, and to provide a signal to adjust the drive value based on the comparison.

11. The driver as claimed in claim 10; wherein the driver is adapted to reduce the drive value to a second level upon identifying that the drive voltage has reached the first target value.

12. The driver as claimed in claim 10; wherein the driver is adapted to increase the drive value to a third level upon identifying that the drive voltage has reached the second target value.

13. The driver as claimed in claim 10; wherein the switch comprises a threshold voltage above which the switch starts conducting the switch-current; and wherein the first target value is greater than the threshold voltage.

14. The driver as claimed in claim 13; wherein the second target value is greater than the threshold voltage.

15. The driver as claimed in claim 12; wherein the third level is greater than the first level.

16. The driver as claimed in claim 10; wherein the adjuster is adapted to adjust the said another level to maintain the drive voltage substantially constant as long as the parasitic current remains positive.

17. The driver as claimed in claim 11 wherein the second level is substantially equal to the parasitic current.

18. The driver as claimed in claim 11; wherein the parasitic current is null when the drive voltage increases above the first target value.

19. A circuit comprising a driver coupled to a switch; wherein the driver is provided according to claim 9.

* * * * *

UNITED STATES PATENT AND TRADEMARK OFFICE
CERTIFICATE OF CORRECTION

PATENT NO. : 10,622,991 B2
APPLICATION NO. : 16/125086
DATED : April 14, 2020
INVENTOR(S) : Zhenyu Song et al.

It is certified that error appears in the above-identified patent and that said Letters Patent is hereby corrected as shown below:

On the Title Page

In the Inventors (72) section, delete third Inventor last name "Zi" and replace with -- Qi --.

Signed and Sealed this
Fifteenth Day of November, 2022

Katherine Kelly Vidal
*Director of the United States Patent and Trademark Office*